United States Patent [19]

Phy

[11] 4,380,566
[45] Apr. 19, 1983

[54] RADIATION PROTECTION FOR INTEGRATED CIRCUITS UTILIZING TAPE AUTOMATED BONDING

[75] Inventor: William S. Phy, Los Altos Hills, Calif.

[73] Assignee: Fairchild Camera & Instrument Corp., Mountain View, Calif.

[21] Appl. No.: 282,569

[22] Filed: Jul. 13, 1981

[51] Int. Cl.³ .................. B32B 23/02; B32B 15/08
[52] U.S. Cl. .................................. 428/192; 428/458; 428/473.5; 428/901; 174/68.5; 29/840
[58] Field of Search ............ 428/192, 458, 901, 473.5; 29/840; 174/68.5

[56] References Cited

U.S. PATENT DOCUMENTS

| | | | |
|---|---|---|---|
| 3,700,538 | 10/1972 | Kennedy | 428/458 |
| 3,801,427 | 4/1974 | Morishita et al. | 428/458 |
| 3,940,534 | 2/1976 | Fick et al. | 428/458 |
| 4,148,969 | 4/1979 | Henderson | 428/458 |
| 4,254,172 | 3/1981 | Takahashi et al. | 428/192 |

OTHER PUBLICATIONS

T. G. O'Neill, "The Status of Tape Automated Bonding", Semiconductor International Feb. 1981, pp. 33, 34, 36, 38, 40, 42, 44, 46, 48, 50, 51.

Primary Examiner—P. Ives
Attorney, Agent, or Firm—Kenneth Olsen; Theodore S. Park; Michael J. Pollock

[57] ABSTRACT

A technique is disclosed for protecting integrated circuits from alpha particles. A central portion of a radiation resistant insulating substrate upon which electrically conductive leads are disposed is positioned in proximity to the integrated circuit. When the leads are electrically connected to the integrated circuit, the central portion of the substrate is allowed to remain over the integrated circuit to protect the integrated circuit. The insulating substrate typically comprises a polyimide film resistant to alpha particles.

8 Claims, 2 Drawing Figures

RADIATION PROTECTION FOR INTEGRATED CIRCUITS UTILIZING TAPE AUTOMATED BONDING

BACKGROUND OF THE INVENTION

1. Field of the Invention

This invention relates to integrated circuits, and in particular, to a method of protecting an integrated circuit from radiation by fabricating a layer of radiation resistant material over the surface of the integrated circuit structure at the same time leads are attached to the integrated circuit.

2. Description of the Prior Art

Tape automated bonding of leads to integrated circuits is well known. Tape automated bonding provides a technique for interconnecting leads to integrated circuits by fabricating the leads on a continuous film support. The film is usually a plastic material along the edges of which sprocket holes have been formed to enable advancement of the film support and leads in automated bonding equipment. Typically, the leads are formed by depositing a thin film of copper or other electrically conductive material on the surface of the plastic. This conductive material is then etched to create the desired pattern of leads.

In the prior art, each pattern of leads has associated with it a central window or opening, termed a "personality window," in the continuous film support plastic or other material. The conductive leads are cantilevered over the edge of the supporting structure into the personality window, and are bonded to the integrated circuit die. Integrated circuits used in conjunction with such a technique include a raised portion of electrically conductive material known as a "bump" wherever a lead is to be attached. The leads on the plastic substrate are bonded to the bumps using well known processes, for example, reflow solder or thermal compression.

Also known is a technique for protecting an integrated circuit from incident radiation by covering the upper surface of the integrated circuit with liquid plastic of a radiation resistant type. The integrated circuit with liquid plastic is then heated to cure the liquid plastic. Unfortunately, such an operation requires an extra production step and causes a diminished yield of acceptable quality products because shrinkage of the plastic often destroys the bonds made between the leads and the die.

SUMMARY OF THE INVENTION

According to this invention integrated circuits may be protected from radiation by covering the die with a radiation resistant plastic material at the same time tape automated bonding is performed to connect an external set of electrically conductive leads to the die. The invention provides an advantage over prior art techniques of coating the chip with liquid plastic material because no curing of the material is necessary and no extra process steps to fabricate the completed device, including packaging, are required.

In one embodiment a composite structure for use in fabricating electrical connections to an integrated circuit comprises an insulating substrate having a central portion adapted to be disposed on the surface of the integrated circuit and having a peripheral portion disposed about at least part of the central portion, and a pattern of electrically conductive material disposed at least on the peripheral portion of the insulating substrate, whereby the pattern of electrically conductive material may be connected to the integrated circuit and the central portion of the insulating substrate disposed over the integrated circuit.

In another embodiment a method of protecting an integrated circuit from radiation comprises fabricating an electrically insulating substrate from a radiation resistant material, the substrate including a central portion and a peripheral portion; fabricating a plurality of electrically conductive leads on at least the peripheral portion of the substrate; attaching individual ones of the plurality of the electrically conductive leads to the integrated circuit; and attaching the central portion of the electrically insulating material to the integrated circuit to thereby protect the integrated circuit from radiation.

DESCRIPTION OF THE PREFERRED EMBODIMENT

In tape automated bonding, electrically conductive interconnections are made to an integrated circuit die to enable interconnection of the die with a larger package. Such connections usually are made by fabricating a film of electrically conductive material on an underlying insulating substrate, and then patterning the electrically conductive material using known techniques. The insulating substrate may itself comprise one or more layers of material. Typically, the insulating substrate is perforated along one or both edges with holes used for advancement and registration of the conductive pattern.

Figure 1:
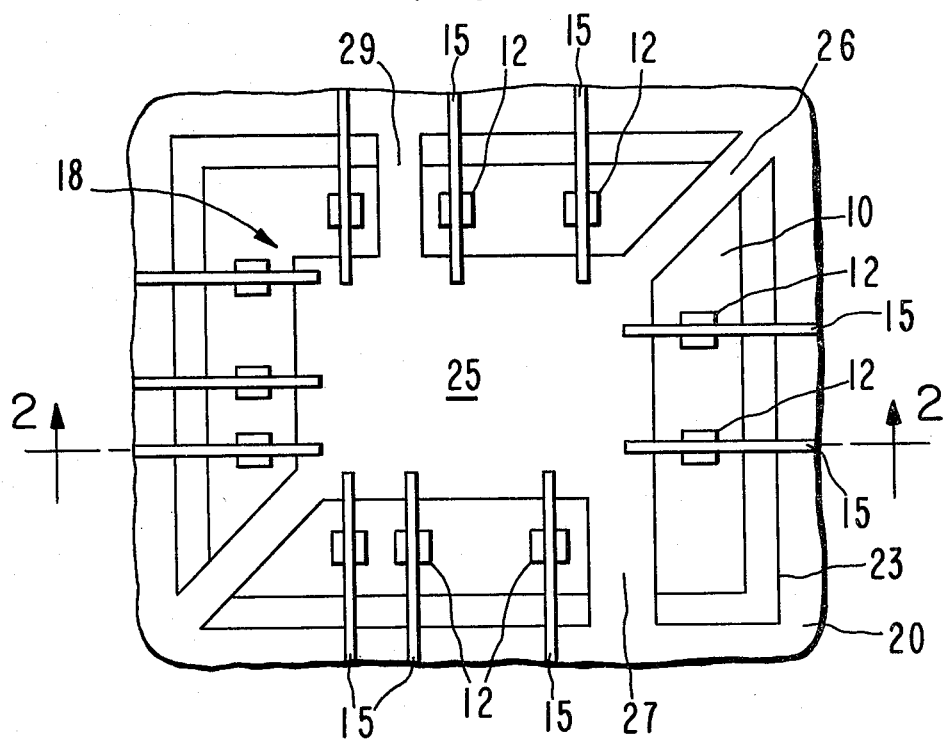
FIG. 1 is a top view of an integrated circuit die illustrating how radiation resistant material may be used to protect the integrated circuit while simultaneously supporting the electrically conductive leads to the integrated circuit.

FIG. 1 shows an enlarged view of an integrated circuit die 10 having a plurality of bonding pads 12 adapted for electrical connections. In conventional tape automated bonding systems, the bonding pads 12 are fabricated to have a small electrically conductive "bump" on each pad which projects above the plane of the surface of the integrated circuit structure 10. Electrically conductive leads 15 may be bonded to the bumps 12 to provide an electrical connection to the integrated circuit 10. The opposite ends (not shown) of leads 15 may be connected to any desired apparatus, for example, an integrated circuit package or a lead frame.

Figure 2:
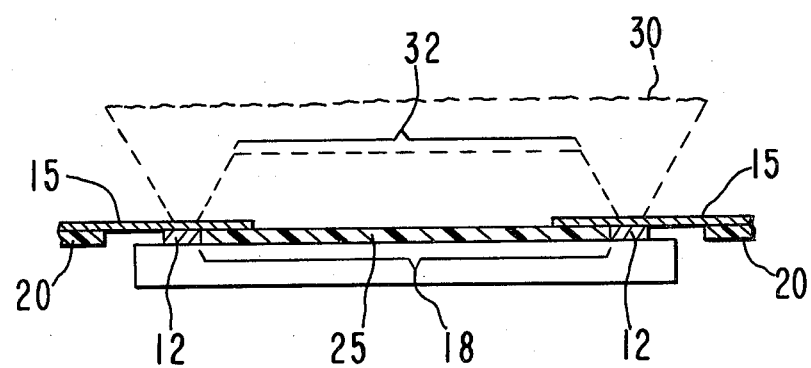
FIG. 2 is a cross-sectional view of the structure shown in FIG. 1.

As illustrated in both FIGS. 1 and 2 the bumps 12 are typically disposed around the perimeter of the die 10, with the active and/or passive electronic components fabricated in a central portion 18 of the integrated circuit die 10. The electrically insulating material 20 shown in FIG. 1 includes a central portion 25 which covers a selected region of a center of the integrated circuit die 10. Prior art tape automated bonding systems do not include this central region 25. Central portion 25 is supported by, and connected to, region 20 by any desired arrangement of supporting members 26, 27, 28 and 29. The particular size and location of the supporting members 26, 27, 28 and 29 chosen will depend upon the particular orientation of bumps 12 around the perimeter of integrated circuit die 10. After bonding leads 15 to bumps 12 any undesired portions of the peripheral region of substrate 20 may be cut away.

The primary advantage of the structure depicted in FIG. 1 is that by manufacturing substrate 20 from a material effective in blocking alpha particles or other undesired radiation, the integrated circuit die 10 is itself protected from radiation. It is particularly desirable to protect die 10 from alpha particles. Alpha particles are emitted from metals, ceramics, and some plastic materials. When alpha particles impinge on a semiconductor memory cell, they may change the state of a bit within the memory cell resulting in a phenomenon known in the industry as "soft-bit error." Although the resulting error may be corrected using known error correction and detection schemes such as hamming error codes, multiple soft bit errors may create a condition which the error detection and correction scheme will be unable to correct. Accordingly, shielding of integrated circuit die 10 from alpha particles or other incident radiation is extremely desirable. By fabricating the substrate 20 from a material which emits relatively few alpha particles, and which is resistant to the passage of alpha particles, the central portion 25 of insulating substrate 20 will provide a protective coating over the central region of die 10 thereby protecting die 10 from alpha particles.

One material known to be an effective barrier against alpha particles, as well as being a material which itself emits relatively few alpha particles, is Kapton (TM), a fully imidized polyimide manufactured by DuPont. I have found this film to be useful for processing integrated circuit die at temperatures in excess of 400° C. Another suitable material is Tradlon (TM) manufactured by Exxon. Also suitable are films comprising poly-parabanic acid.

An additional advantage of my invention is the fact that by allowing the central portion 25 of Kapton (TM) or other material to contact the surface of die 10, the electrically conductive leads 15 no longer need be cantilevered from substrate 20. Instead, and as depicted both in FIG. 1 and FIG. 2, the conductive leads 15 may extend from the peripheral region of substrate 20 to the central portion 25. In this manner the electrically conductive leads 15 are supported at opposite ends, and consequently less subject to bending or breaking. Moreover, alignment of leads 15 to bumps 12 is improved.

FIG. 2 shows a cross-sectional view of the structure shown in FIG. 1. As shown in FIG. 2 the central portion 25 of substrate 20 is placed in direct contact with the upper surface of die 10. The dashed lines 30 indicate the tip of a thermode or other known tool having a recessed central portion 32 which would be suitable for bonding leads 15 to bumps 12. As depicted, central portion 25 of substrate 20 will also serve as a particle screen to block impinging alpha particles.

Although embodiments of the invention have been described above, it will be apparent to those skilled in the art that numerous variations may be employed to satisfactorily provide a particle screen for an integrated circuit structure without departing from the scope of the appended claims. For example, if it is desirable not to allow the central portion 25 of the substrate material 20 to contact die 10, the electrically conductive material 15 may be disposed on the lower surface of substrate 20. In this manner the conductive leads 15 will support central portion 25 and provide a small space between the film support 20 and the die 10.

What is claimed is:

1. A composite structure for use in fabricating electrical connections to an integrated circuit comprising:
   an insulating substrate having a central portion adapted to be disposed in proximity to the surface of the integrated circuit and having a peripheral portion disposed about at least part of the central portion, the peripheral portion being separated from the central portion at selected locations; and
   a pattern of electrically conductive material disposed on at least the peripheral portion of the insulating substrate whereby the pattern of electrically conductive material is adapted to be connected to the integrated circuit where the peripheral portion is separated from the central portion, and the central portion of the insulating substrate is disposed in proximity to the integrated circuit.

2. A structure as in claim 1 wherein the pattern of electrically conductive material is disposed on both the peripheral portion and the central portion of the insulating substrate.

3. A structure as in claim 2 wherein the insulating substrate comprises a polyimide film.

4. A structure as in claim 3 wherein the polyimide film is Kapton$_{TM}$.

5. A structure as in claim 2 wherein the insulating substrate comprises a poly-parabanic acid film.

6. A structure as in claim 5 wherein the poly-parabanic acid film is Tradlon$_{TM}$.

7. A structure as in claim 1 where the central portion of the insulating substrate is disposed in contact with the surface of the integrated circuit.

8. A structure as in claim 1 wherein the central portion of the insulating substrate is disposed above the surface of the integrated circuit.

* * * * *